(12) United States Patent
Chang et al.

(10) Patent No.: US 9,379,180 B2
(45) Date of Patent: Jun. 28, 2016

(54) SUPER JUNCTION FOR SEMICONDUCTOR DEVICE AND METHOD FOR MANUFACTURING THE SAME

(71) Applicant: PFC Device Holdings Limited, Chai Wan (HK)

(72) Inventors: Paul Chung-Chen Chang, Saratoga, CA (US); Kuo-Liang Chao, New Taipei (TW); Mei-Ling Chen, New Taipei (TW); Lung-Ching Kao, New Taipei (TW)

(73) Assignee: PFC DEVICE HOLDINGS LIMITED, Chai Wan (HK)

( * ) Notice: Subject to any disclaimer, the term of this patent is extended or adjusted under 35 U.S.C. 154(b) by 0 days.

(21) Appl. No.: 14/104,525

(22) Filed: Dec. 12, 2013

(65) Prior Publication Data

US 2014/0167205 A1 Jun. 19, 2014

(30) Foreign Application Priority Data

Dec. 13, 2012 (TW) .............................. 101147146 A

(51) Int. Cl.
| | |
|---|---|
| *H01L 29/06* | (2006.01) |
| *H01L 21/266* | (2006.01) |
| *H01L 21/265* | (2006.01) |
| *H01L 21/324* | (2006.01) |
| *H01L 29/08* | (2006.01) |
| *H01L 29/66* | (2006.01) |
| *H01L 29/739* | (2006.01) |
| *H01L 29/74* | (2006.01) |
| *H01L 29/861* | (2006.01) |
| *H01L 29/872* | (2006.01) |
| *H01L 29/78* | (2006.01) |
| *H01L 29/749* | (2006.01) |

(52) U.S. Cl.
CPC .......... *H01L 29/0634* (2013.01); *H01L 21/266* (2013.01); *H01L 21/26513* (2013.01); *H01L 21/324* (2013.01); *H01L 29/0878* (2013.01); *H01L 29/66136* (2013.01); *H01L 29/66143* (2013.01); *H01L 29/66333* (2013.01); *H01L 29/66363* (2013.01); *H01L 29/66712* (2013.01); *H01L 29/7393* (2013.01); *H01L 29/74* (2013.01); *H01L 29/749* (2013.01); *H01L 29/7802* (2013.01); *H01L 29/861* (2013.01); *H01L 29/872* (2013.01)

(58) Field of Classification Search
CPC .................................................. H01L 29/0634
USPC ........................................................ 438/140
See application file for complete search history.

(56) References Cited

U.S. PATENT DOCUMENTS 5,216,275 A * 6/1993 Chen ............................ 257/493
6,184,555 B1 2/2001 Tihanyi et al.
(Continued)

FOREIGN PATENT DOCUMENTS

CN 1436372 A 8/2003

*Primary Examiner* — Reema Patel
*Assistant Examiner* — Syed Gheyas
(74) *Attorney, Agent, or Firm* — Muncy, Geissler, Olds & Lowe, P.C.

(57) ABSTRACT

A super junction for semiconductor device includes a silicon substrate with a first conductive type epitaxial layer, a plurality of highly-doped second conductive type columns formed in the first conductive type epitaxial layer, and a plurality of lightly-doped (first conductive type or second conductive type) side walls formed on outer surfaces of the highly-doped second conductive type. The semiconductor device is super-junction MOSFET, super junction MOSFET, super junction Schottky rectifier, super junction IGBT, thyristor or super junction diode.

4 Claims, 17 Drawing Sheets

(56) References Cited

U.S. PATENT DOCUMENTS

| | | |
|---|---|---|
| 6,608,350 B2 | 8/2003 | Kinzer et al. |
| 6,900,109 B2 | 5/2005 | Onishi et al. |
| 2003/0132450 A1* | 7/2003 | Minato et al. ................. 257/110 |
| 2014/0097491 A1* | 4/2014 | Bulucea .............. H01L 29/7811 257/341 |

* cited by examiner

SUPER JUNCTION FOR SEMICONDUCTOR DEVICE AND METHOD FOR MANUFACTURING THE SAME

BACKGROUND OF THE INVENTION

1. Field of the Invention

The present invention relates to a semiconductor structure and a method for manufacturing the same, especially to a super junction for semiconductor device and a method for manufacturing the same.

2. Description of Related Art

Since the first introduction by Dr. Chen in 1991, super junction devices are under substantive research for improved performance.

For example, U.S. Pat. No. 6,608,350 was disclosed with a trench type super junction device. FIG. 1 shows the sectional view of the trench type super junction device in U.S. Pat. No. 6,608,350. The trench type super junction MOS device comprises a substrate 81, an N type epitaxial layer 82, a plurality of parallel trenches 83, P type layer 84 on sidewall of each trench 83, P base 93 on the N type epitaxial layer 82, gate oxide layer 87 and gate 88 between two adjacent trenches 83 and atop the N type epitaxial layer 82, source 89 and source electrode 91 atop the P base 93, and dielectric layer (not labeled) in the P type layer 84. In conductive mode, a bias is applied to the gate 88 and the source 89 is grounded. A channel is formed between the P base 93 and the gate oxide layer 87 and current is generated when bias is applied to drain of this device. The P type layer 84 on sidewall of each trench 83 can provide lower on resistance RDSON. In conventional MOS device, the resistivity of the N type epitaxial layer 82 should be lower (the doping concentration should be higher) to reduce on resistance RDSON. However, the voltage tolerance is affected when the doping concentration of the N type epitaxial layer 82 increases.

The above-mentioned super junction structure can provide the advantage of both high voltage tolerance and lower on resistance. However, it is difficult to form trench with high aspect ratio on N type epitaxial layer 82. Therefore, a novel super junction structure for semiconductor device and method for the same are desirable.

There are several methods using repeated epitaxial growth and implant P-column steps to form superjunction MOSFET according to charge balance concept theory. Unfortunately, this process is very sensitive to process tolerance (<1%), which is not manufacturable for existing tool capability in epitaxial reactors and ion implanters. Once ion implant and epitaxial growth are completed, there is no way to do fine tuning.

The present invention is proposed to form a second implant step for fine tuning current dose or counter dose to obtain much better charge balance. 4-point SRP and P-column cross dimension (CD) data are required after ion implantation to determine how much the concentration and charge are introduced. Compared it with the target, the balance concentration and charge can be calculated. Then, a modified dose of second implant will be implanted to meet target. The extra center and peripheral areas are for the second implant to do better charge balance. In this way, for example, breakdown voltage (BV) will be in the range of 600V-700V instead of 500V-600V in mass production (MP).

SUMMARY OF THE INVENTION

The object of the present invention is to provide a novel super junction structure for semiconductor device and method of manufacturing the same, the super junction structure has high aspect ratio and the semiconductor device using the super junction structure has high reverse voltage blockage.

Accordingly, the present invention provides a method for manufacturing the super junction structure of semiconductor device, comprising steps in the sequence of: (a) providing a silicone substrate and forming a first conductive type epitaxial layer thereon; (b) forming two patterned mask layers (including a bottom mask layer and a top mask layer) on top of the first conductive type epitaxial layer. Typically, the bottom mask layer is LTO (low temperature oxide) layer functioning as hard mask and the top mask layer is PR (photo resist); (c) ion-implanting a high-concentration second conductive type ion on a portion of the first conductive type epitaxial layer which is not covered by the patterned mask layers; (d) undercutting the bottom mask layer and removing the top mask layer; (e) ion-implanting a low-concentration second conductive type or first conductive type ion on a portion of the first conductive type epitaxial layer, which is not covered by the undercut bottom mask layer; (f) removing the bottom mask layer and forming a first conductive type epitaxial covering layer on resulting structure; (g) repeating above step (b) to step (f) to form a plurality of high-concentration second conductive type dopant layers and a plurality of low-concentration dopant layers; (h) forming a field oxide layer on resulting structure and performing thermal driving-in to connect the plurality of high-concentration second conductive type dopant layers and to connect the plurality of low-concentration dopant layers such that a heavily-doped second conductive type column and a lightly-doped sidewall are formed in the first conductive type epitaxial layer.

Accordingly, the present invention provides a method of manufacturing the super junction structure for semiconductor device, comprising a silicon substrate with a first conductive type epitaxial layer, a plurality of highly-doped second conductive type columns formed in the first conductive type epitaxial layer, and a plurality of lightly-doped second conductive type (or first conductive type) side walls formed on outer surfaces of the highly-doped second conductive type.

Moreover, the above-mentioned semiconductor device can be at least one of super junction metal oxide semiconductor field effect transistor (MOSFET), super junction metal semiconductor field effect transistor (MESFET), super junction Schottky Rectifier, super junction insulated gate bipolar transistor (IGBT), super junction thyristor, super junction diode, etc,

BRIEF DESCRIPTION OF DRAWING

There are three new inventions in the application. The features of the novel invention are set forth with particularity in the appended claims. The invention itself however may be best understood by referring to the following detailed description of the invention. It describes certain exemplary embodiments of the invention, which is taken in conjunction with the accompanying drawings as follows:

DETAILED DESCRIPTION OF THE INVENTION

Figure 1:
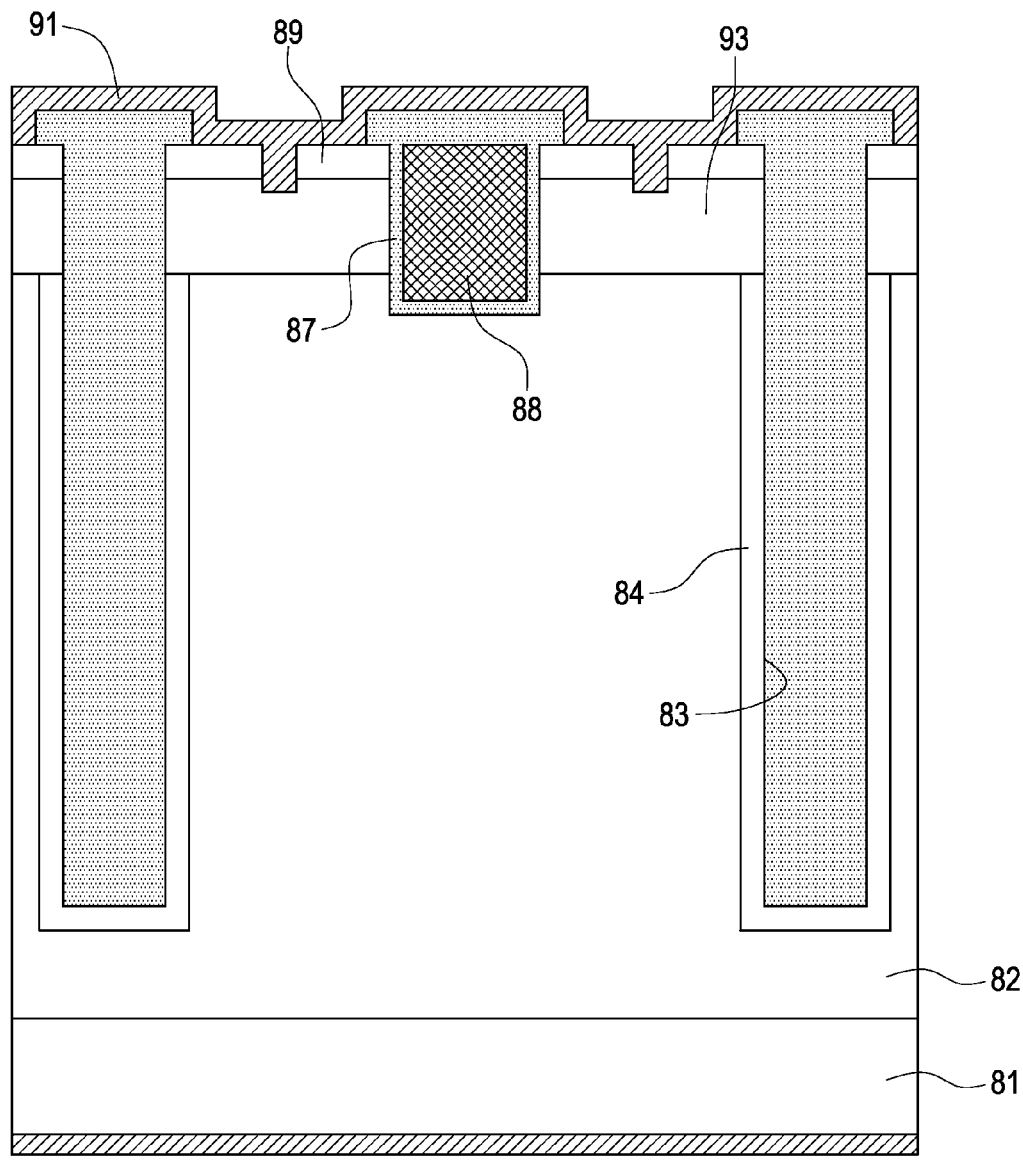
FIG. 1 shows the cross-sectional view of the conventional trench type super junction device.
Figure 2A:
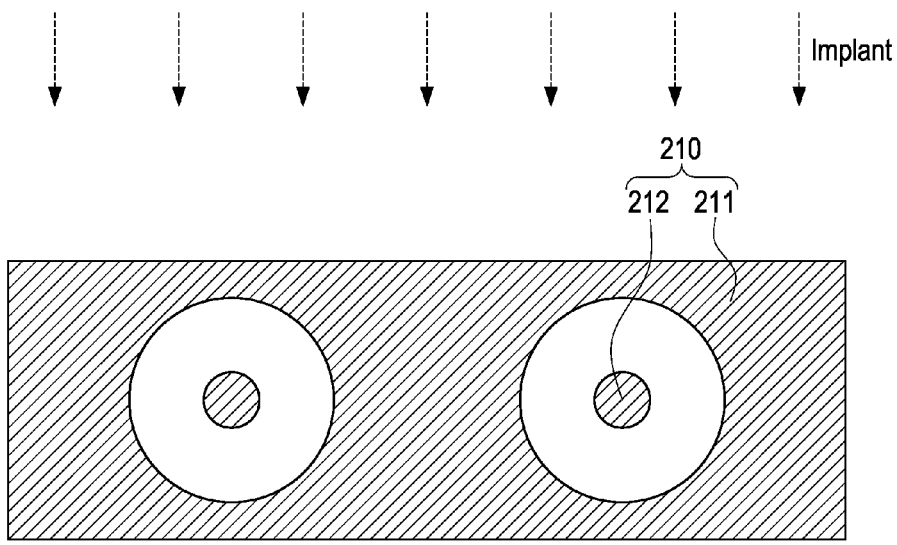
FIGS. 2A to 2D show top views of the first method for manufacturing the super junction structure for semiconductor device according to the embodiment of the present invention.
Figure 3A:
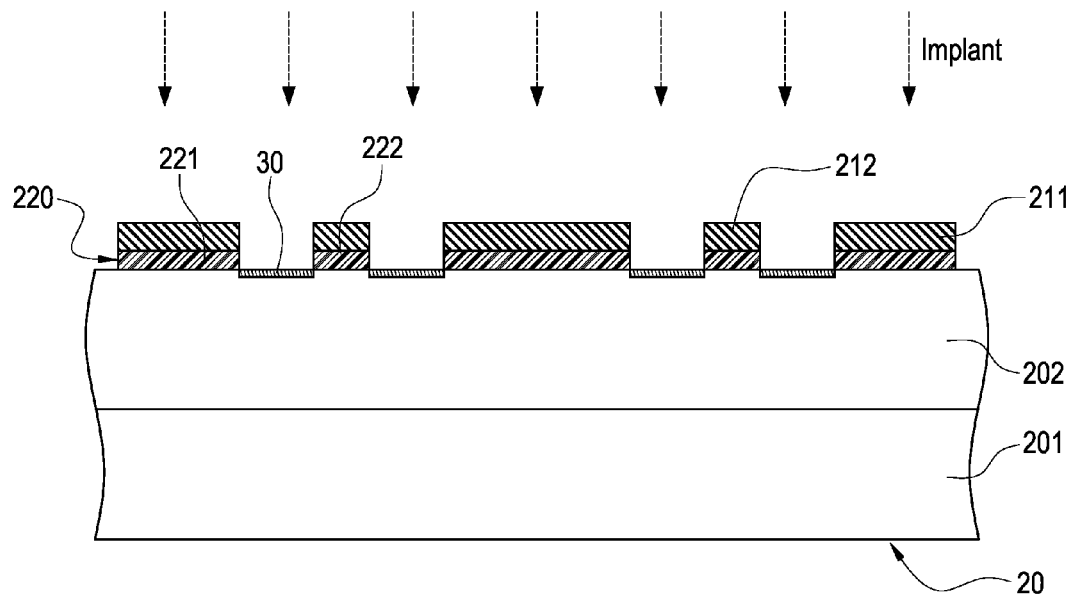
FIGS. 3A to 3F show cross-sectional views of the first method for manufacturing the super junction structure for semiconductor device according to the embodiment of the present invention.
Figure 2B:
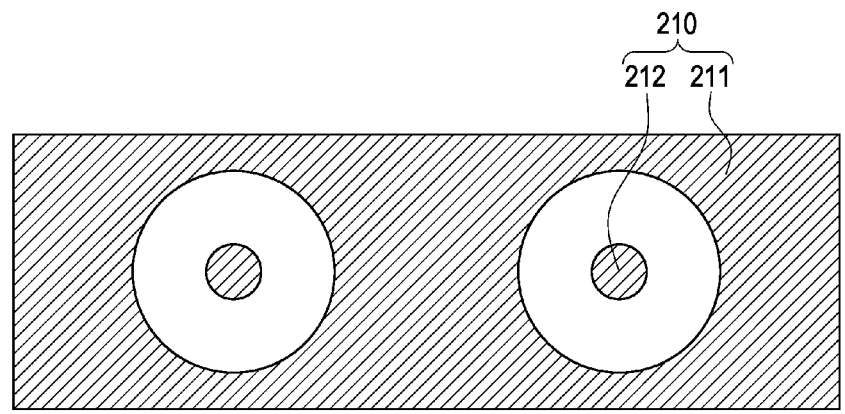

FIGS. 2A and 3A show the top view and section view for illustrating the first method of manufacturing super junction for semiconductor device according to the first embodiment of the invention. As first shown in FIG. 3A, a semiconductor substrate 20 with a heavily-doped N-type silicon layer 201 (N+ silicon layer) and a lightly-doped N-type epitaxial layer 202 (N− epitaxial layer) is provided, where the lightly-doped N-type epitaxial layer 202 can be formed on top of the semiconductor substrate 20 by epitaxial process. The drawing is not sketched to the dimensions. Even the lightly-doped N-type epitaxial layer 202 is shown to be thicker than the heavily-doped N-type silicon layer 201, it should be noted the drawing is only for demonstration and the lightly-doped N-type epitaxial layer 202 is actually thinner than the heavily-doped N-type silicon layer 201. Then, a bottom mask layer (not labeled, for example an LTO (Low Temperature Oxide) layer) is grown on the substrate 20 by Low Pressure Chemical Vapor Deposition process and the LTO bottom mask layer are functioned as a hard mask layer. After that, a first photoresist layer (top mask layer) 210 is formed on the bottom mask layer.

As shown in FIGS. 2A and 3A, the first photoresist layer 210 is coated in a center portion layer 212 and an outer portion layer 211 to define annular groove (not labeled) between the center portion layer 212 and the outer portion layer 211. It should be noted that the annular groove is only for demonstration, any closed-loop groove such as ellipse groove or rectangular groove can be used. As shown in FIG. 3A, the first photoresist layer 210 including the center portion layer 212 and the outer portion layer 211 is used as a mask for etching the bottom mask layer. Therefore, a bottom mask layer 220 including an outer mask layer 221 and a center mask layer 222 is formed as shown in FIG. 3A. Afterward, the first photoresist layer 210 including the center portion layer 212 and the outer portion layer 211 is also used as mask for ion-implantation process and boron ion doses with $10^{13}$ cm$^{-3}$ range are doped in the lightly-doped N-type epitaxial layer 202 to form structure shown in FIG. 3A, where the structure includes heavily-doped P type area 30.

Figure 3B:
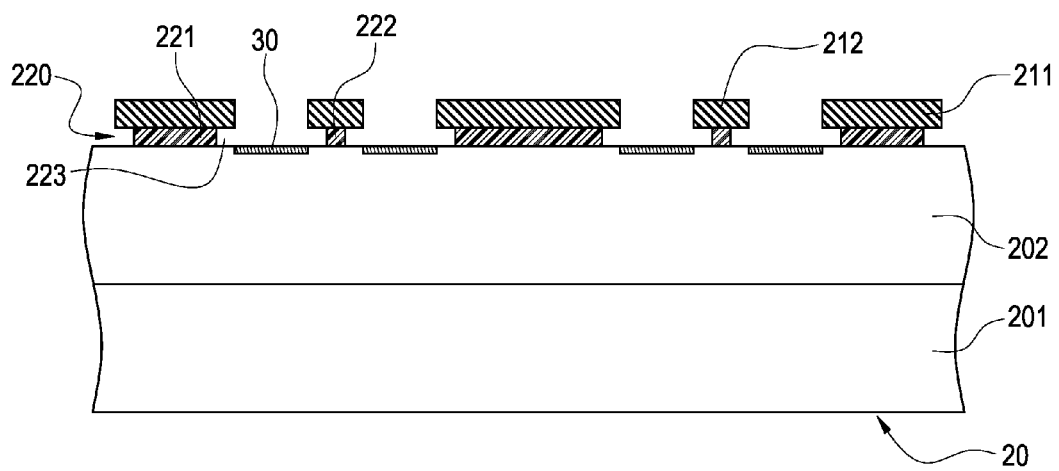

Afterward, as shown in FIG. 3B, the first photoresist layer 210 including the center portion layer 212 and the outer portion layer 211 is used as mask for isotropic etching the bottom mask layer 220 (for example, the etchant can be buffered oxide etchant, BOE). The bottom mask layer 220 below the first portion layer 210 is undercut inward to form recess 223. In other word, part of the first photoresist layer 210 hangs atop the bottom mask layer 220 by removing a portion of the bottom mask layer 220 below the first photoresist layer 210.

Figure 2C:
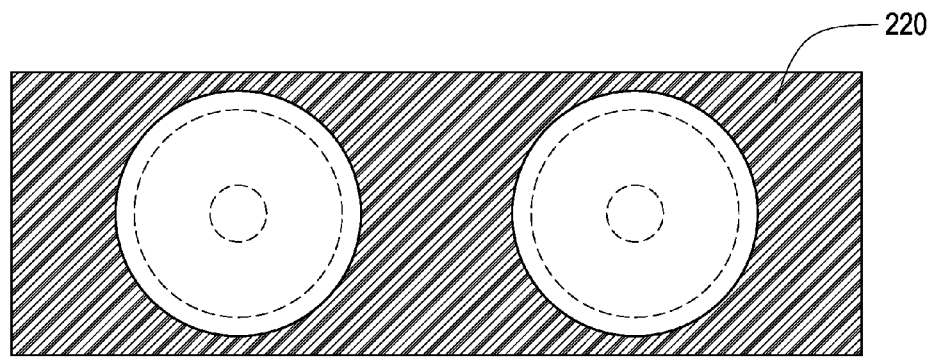
Figure 3C:
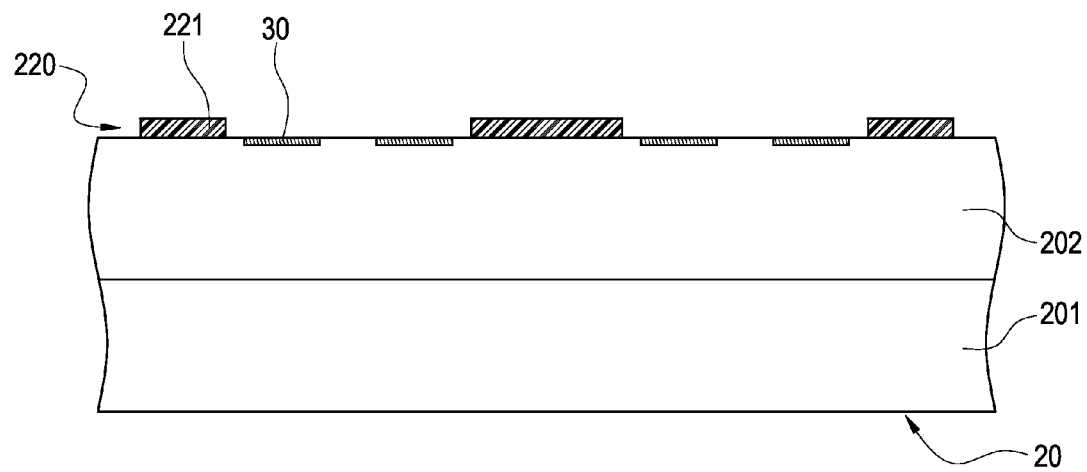
Figure 2D:
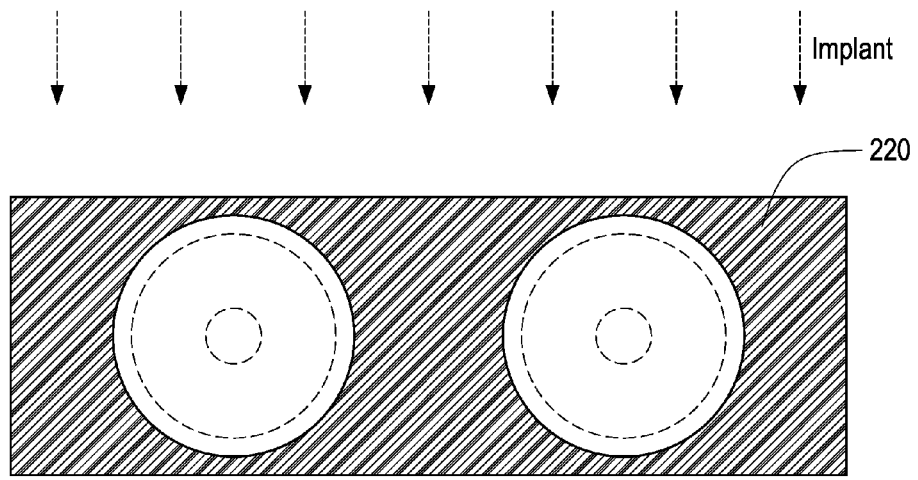

As shown in FIG. 3C, after removing the first photoresist layer 210, a second BOE process is conducted with controlled etching rate to remove the center mask layer 222 such that the remaining bottom mask layer 220 only includes the outer mask layer 221 as shown in FIG. 2C.

Figure 3D:
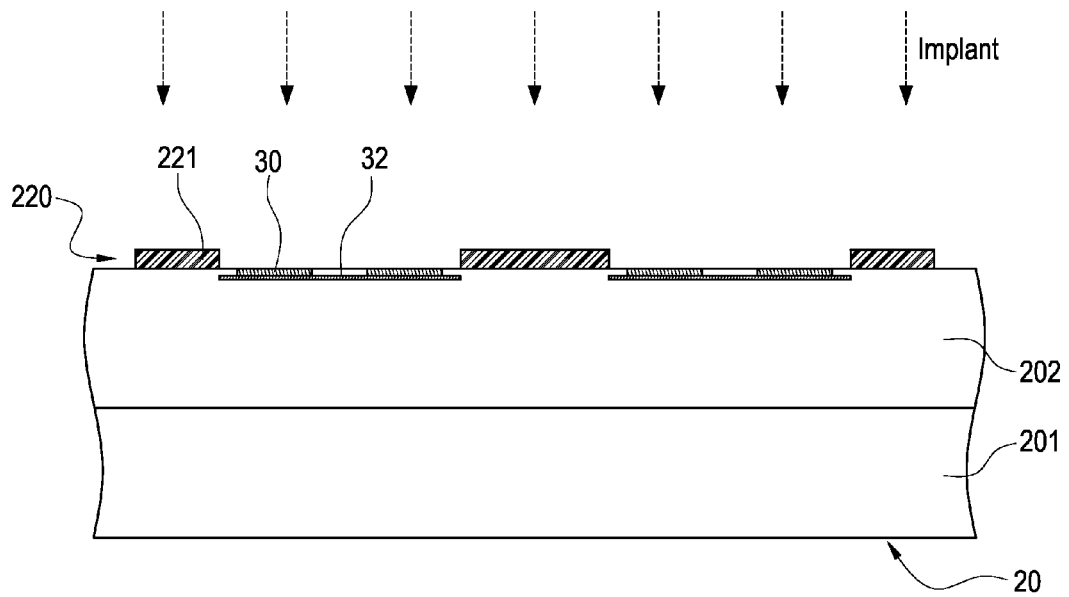

As shown in FIG. 3D, the remaining bottom mask layer 220 is used as mask for low-concentration P or N type doping on the resulting structure. The doping depth is such controlled that a lightly-doped P type area 32 is formed besides the heavily-doped P type area 30. Then the remaining mask layer 220 is removed and a lightly-doped N-type epitaxial covering layer (not shown) is grown to cover the resulting structure.

Figure 3E:
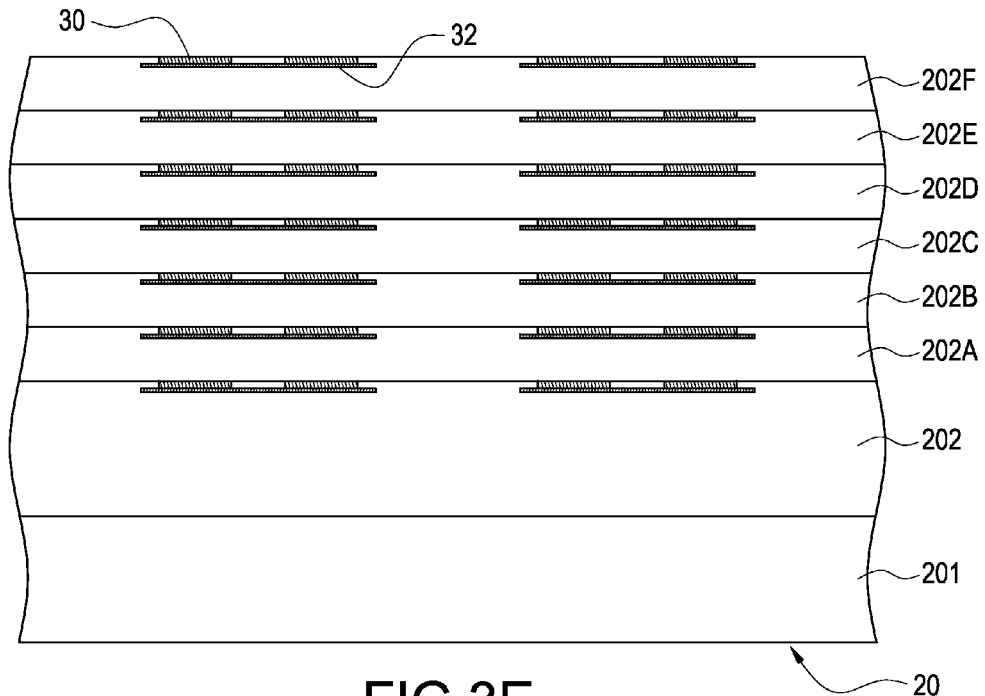

As shown in FIG. 3E, the above-mentioned steps are repeatedly performed (for example, the steps shown in FIGS. 3A to 3D are repeated six times) to form heavily-doped P type areas 30 and lightly-doped P type areas 32 on multiple layers, wherein numerals 202A~202F indicate the above-mentioned lightly-doped N-type epitaxial covering layers.

Figure 3F:
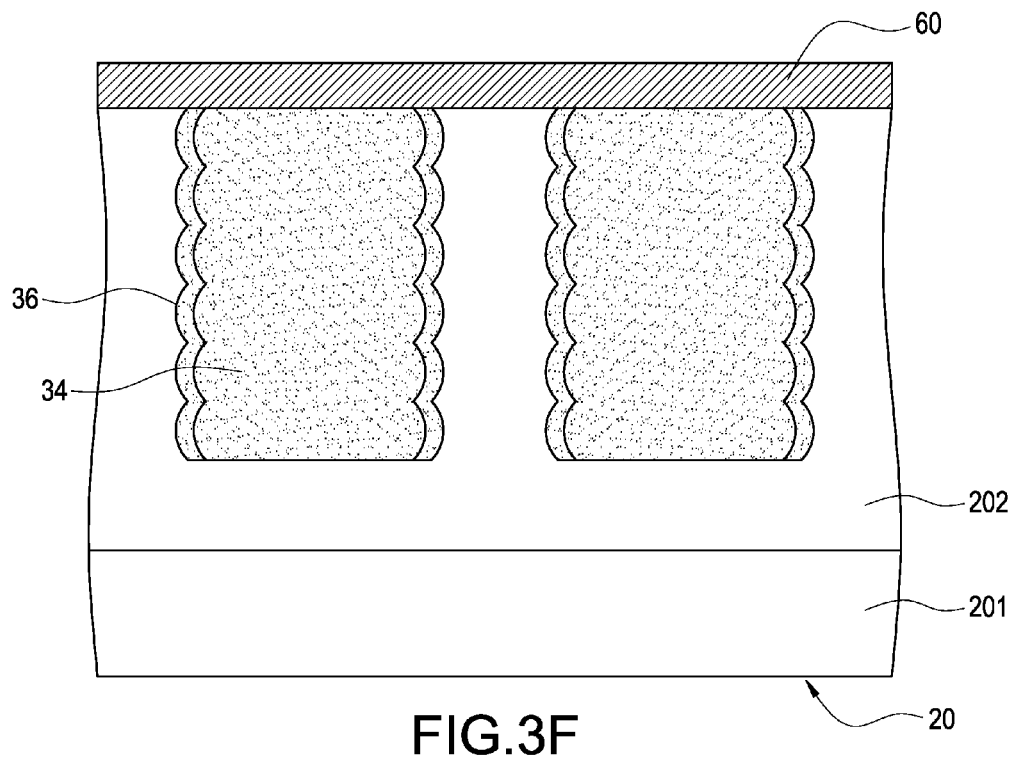

As shown in FIG. 3F, a field oxide layer 60 is formed on the resulting structure and a high-temperature dopant driving-in process is performed to connect the heavily-doped P type areas 30 and lightly-doped P or N type areas 32 on adjacent layers. Therefore, heavily-doped P type column 34 and lightly-doped P or N type sidewall 36 are formed. The resulting structure can be used as base to fabricate further semiconductor devices such as super junction metal oxide semiconductor field effect transistor (MOSFET), super junction metal semiconductor field effect transistor (MESFET), super junction Schottky Rectifier, super junction insulated gate bipolar transistor (IGBT), super junction thyristor or super junction diode.

Moreover, as shown in FIG. 3F, the lightly-doped P or N type sidewall 36 can function as buffer layer between the heavily-doped P type column 34 and the lightly-doped N-type epitaxial layer 202 even though the boundary between the lightly-doped P or N type sidewall 36 and the heavily-doped P type column 34 is not clear due to the long time driving in process. Moreover, even not clearly shown in FIG. 3F, the dopant concentration near the lateral surface of the super junction has nonlinear (such as graded) distribution along transversal direction in the drawing. For example, the dopant concentration monotonically increases from the lightly-doped P or N type sidewall 36 to the heavily-doped P type column 34. The buffer layer provided by the lightly-doped P or N type sidewall 36 can enhance reverse blocking voltage tolerance and charge balance for the later fabricated device such as super junction MOSFET.

Figure 4A:
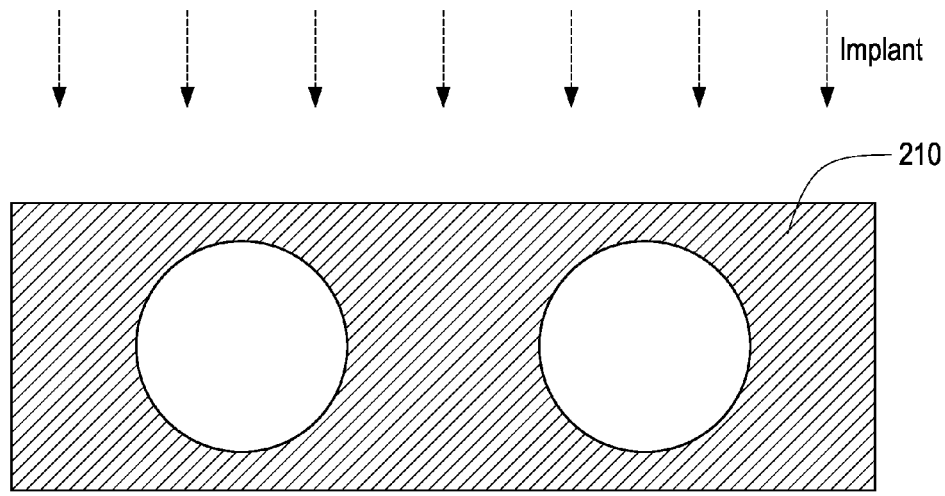
FIGS. 4A to 4D show top views of the second method for manufacturing the super junction structure for semiconductor device according to the embodiment of the present invention.
Figure 5A:
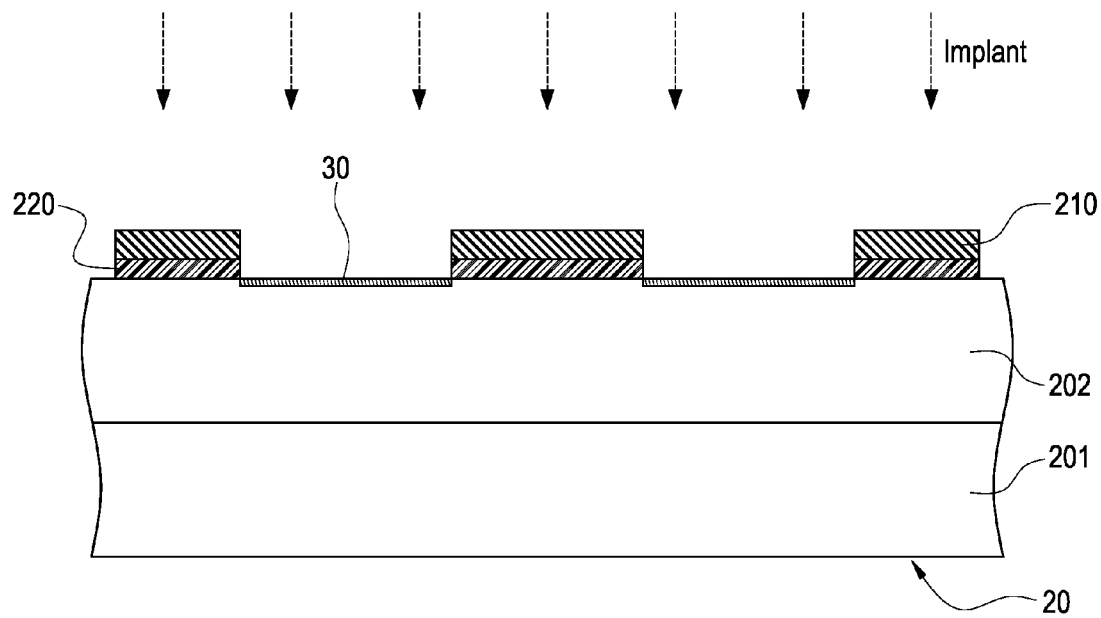
FIGS. 5A to 5F show cross-sectional views of the second method for manufacturing the super junction structure for semiconductor device according to the embodiment of the present invention.

FIGS. 4A and 5A show the top view and cross section view of middle cut line horizontally for illustrating the second method of manufacturing super junction for semiconductor device according to the second embodiment of the invention. As first shown in FIG. 5A, a semiconductor substrate 20 with a heavily-doped N-type siliconlayer 201 (N+ silicon layer) and a lightly-doped N-type epitaxial layer 202 (N− epitaxial layer) is provided. Even the lightly-doped N-type epitaxial layer 202 is shown to be thicker than the heavily-doped N-type silicon layer 201, it should be noted the draw s only for demonstration and the lightly-doped N-type epitaxial layer 202 is actually thinner than the heavily-doped N-type silicon layer 201. Then, a mask layer (not labeled, for example an LTO (Low Temperature Oxide) layer) is grown on the substrate 20 by Low Pressure Chemical Vapor Deposition process. Then, a first photoresist layer 210 is formed on the mask layer. As shown in FIGS. 4A and 5A, the first photoresist layer 210 defines a circular groove (not labeled).

It should be noted that the circular groove is only for demonstration, any closed-loop groove such as ellipse groove or rectangular groove can be used. As shown in FIG. 5A, the first photoresist layer 210 is used as a top mask layer for etching the underlying hard bottom mask layer. Therefore, a bottom mask layer 220 is formed as shown in FIG. 5A. Afterward, the first photoresist layer 210 is used as top mask layer for ion-implantation process and boron ion doses with $10^{13}$ cm$^{-3}$ range are doped in the lightly-doped N-type epitaxial layer 202 to form structure shown in FIG. 5A, where the structure includes heavily-doped P type area 30.

Figure 4B:
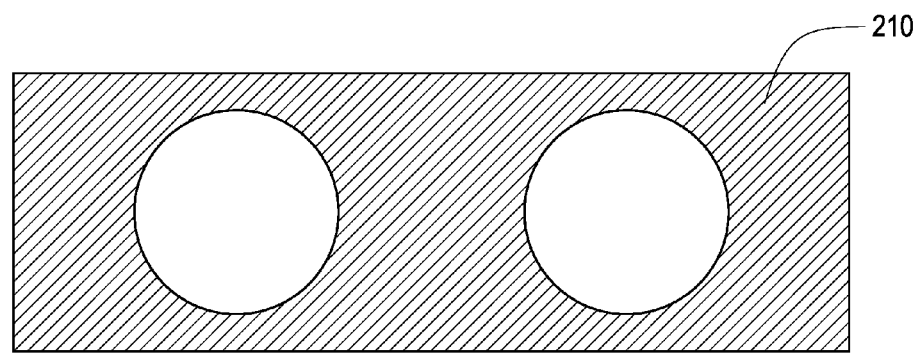
Figure 5B:
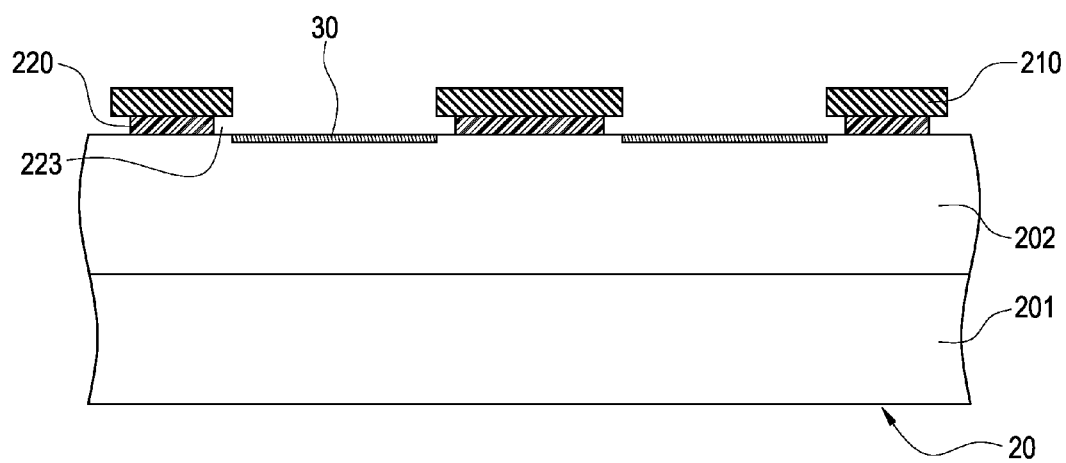

Afterward, as shown in FIGS. 4B and 5B, the first photoresist layer 210 is used as mask for isotropic etching the bottom mask layer 220 (for example, the etchant can be buffered oxide etchant, BOE). The portion of the bottom mask layer 220 below the first photoresist layer 210 is undercut inward to form recess 223. In other word, part of the first photoresist layer 210 hangs atop the bottom mask layer 220 by removing a portion of the bottom mask layer 220 below the first photoresist layer 210.

Figure 4C:
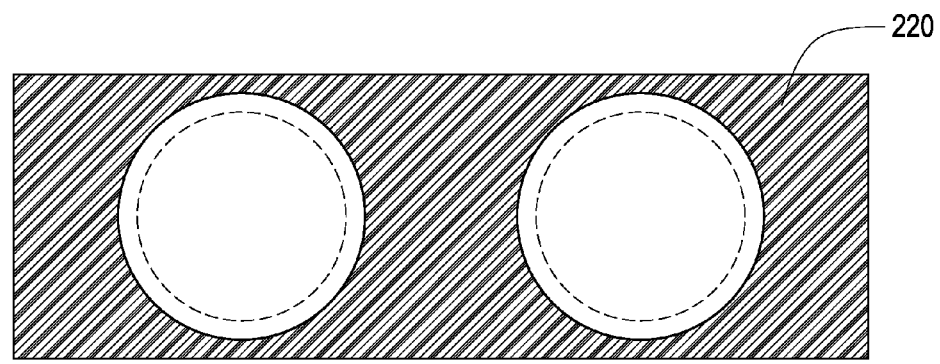
Figure 5C:
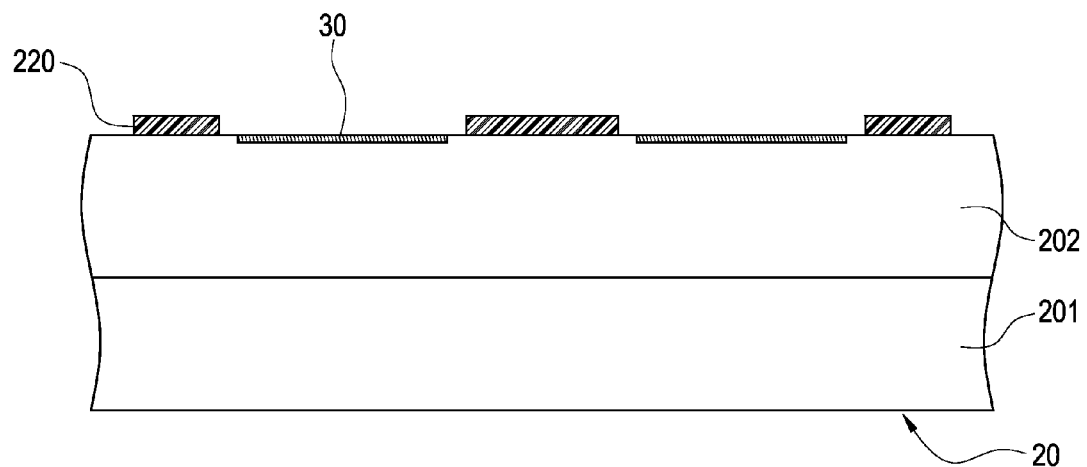
Figure 4D:
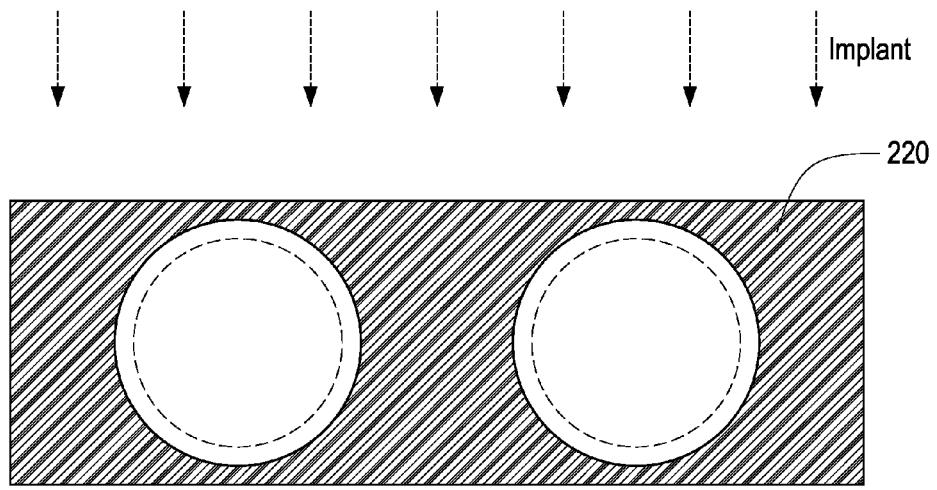

As shown in FIGS. 4C and 5C, after removing the first photoresist layer 210, a second BOE process is conducted with controlled etching rate to remove the surface dirt on the bottom mask layer 220 such that the remaining bottom mask layer 220 is clean as shown in FIG. 5C.

Figure 5D:
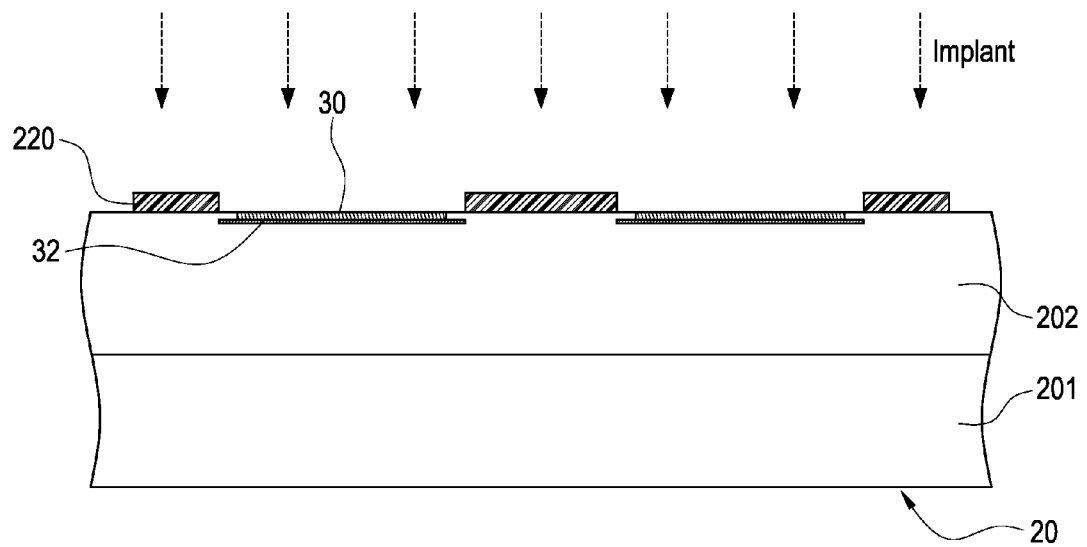

As shown in FIG. 5D, the remaining bottom mask layer 220 is used as mask for low-concentration P or N type doping on the resulting structure. The doping depth is such controlled that a lightly-doped P or N type area 32 is formed besides the heavily-doped P type area 30. Then the remaining bottom mask layer 220 is removed and a lightly-doped N-type epitaxial covering layer (not shown) is grown to cover the resulting structure.

Figure 5E:
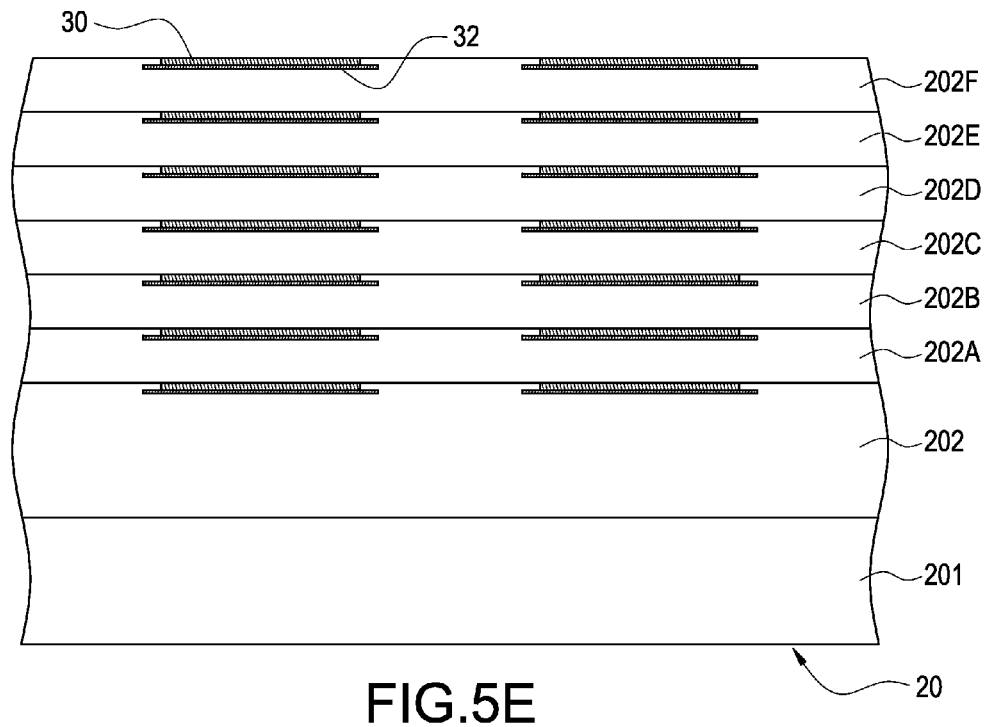

As shown in FIG. 5E, the above-mentioned steps are repeatedly performed (for example, the steps shown in FIGS. 5A to 5D are repeated six times) to form heavily-doped P type areas 30 and lightly-doped P or N type areas 32 on multiple layers, wherein numerals 202A~202F indicate the above-mentioned lightly-doped N-type epitaxial covering layers.

Figure 5F:
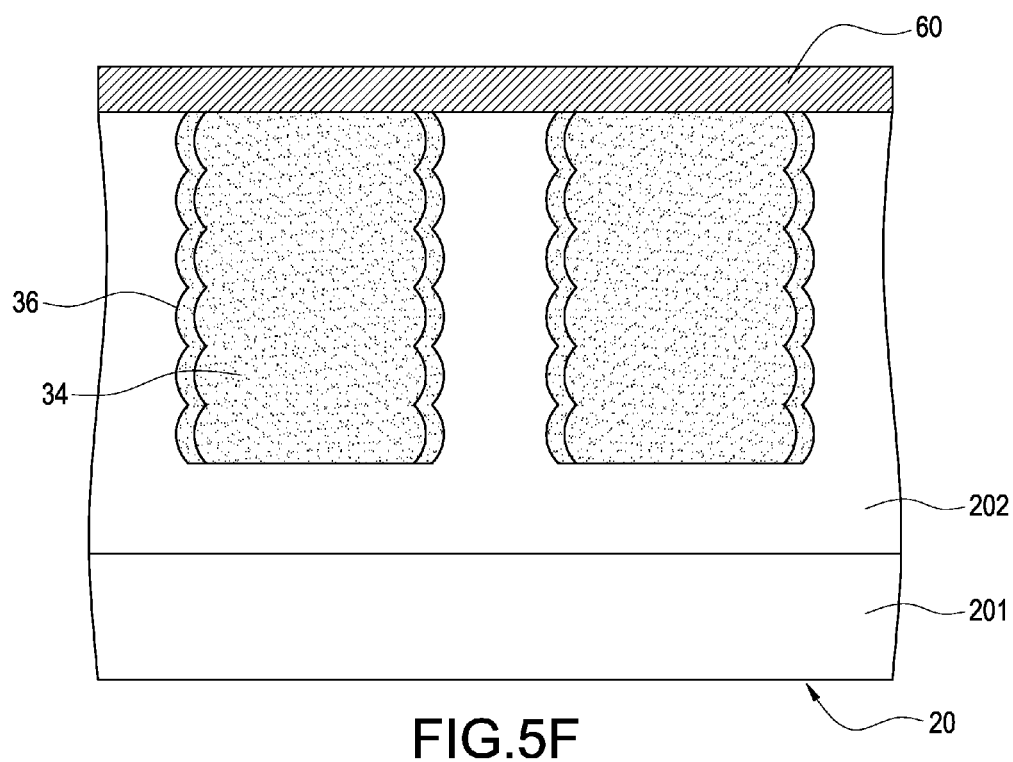

As shown in FIG. 5F, a field oxide layer 60 is formed on the resulting structure and a high temperature dopant driving-in process is performed to connect the heavily-doped P type areas 30 and lightly-doped P or N type areas 32 on adjacent layers. Therefore, heavily-doped P type column 34 and lightly-doped P or N type sidewall 36 are formed. Moreover, even not clearly shown in FIG. 5F, the dopant concentration near the lateral surface of the super junction has nonlinear (such as graded) distribution along transversal direction in the drawing. For example, the dopant concentration monotonically increases from the lightly-doped P or N type sidewall 36 to the heavily-doped P type column 34. The resulting structure can be used as base to fabricate further semiconductor devices such as super junction MOSFET, super junction MESFET, super junction Schottky Rectifier, super junction IGBT, super junction thyristor and super junction diode.

Figure 6A:
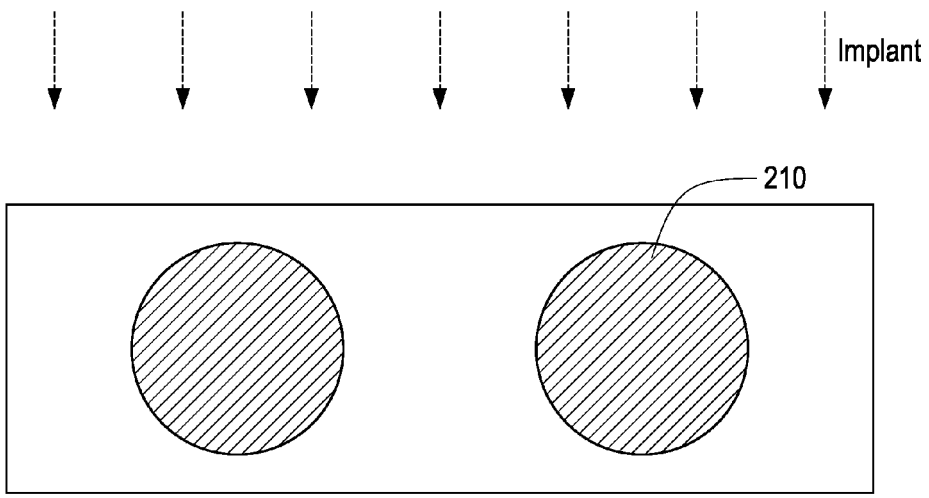
FIGS. 6A to 6D show top views of the third method for manufacturing the super junction structure for semiconductor device according to the embodiment of the present invention.
Figure 7A:
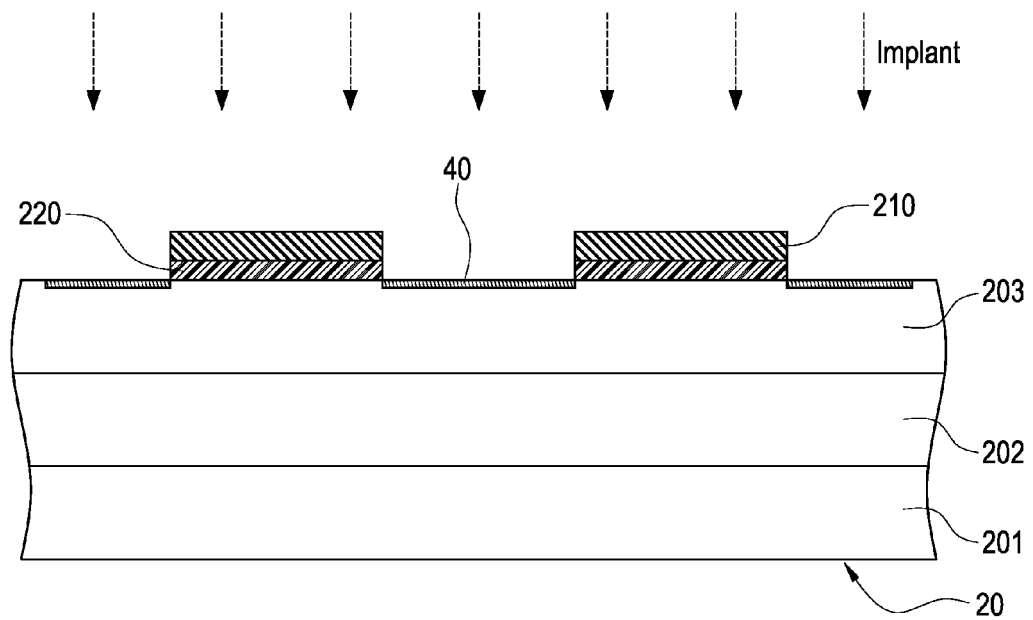
FIGS. 7A to 7F show cross-sectional views of the third method for manufacturing the super junction structure for semiconductor device according to the embodiment of the present invention.
Figure 6B:
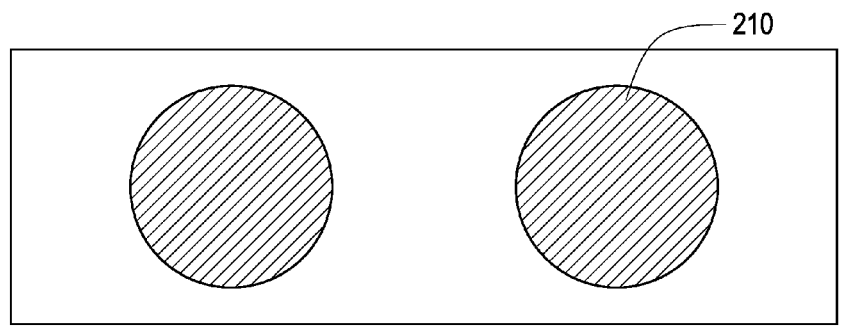

FIGS. 6A and 7A show the top view and cross section view of middle cut line horizontally for illustrating the third method of manufacturing super junction for semiconductor device according to the third embodiment of the invention. As first, shown in FIG. 7A, a semiconductor substrate 20 with a heavily-doped N-type silicon layer 201 (N+ silicon layer) and a lightly-doped N-type epitaxial layer 202 (N− epitaxial layer) are provided. Then a lightly-doped P type epitaxial process is conducted to form a lightly-doped P type epitaxial layer 203 on the lightly-doped N-type epitaxial layer 202. Afterward, a bottom mask layer (not labeled, for example an LTO (Low Temperature Oxide) layer) is grown on the lightly-doped P type epitaxial layer 203 by Low Pressure Chemical Vapor Deposition process. Then, a first photoresist layer 210 functioned as a top mask layer is formed on the bottom mask layer.

As shown in FIGS. 6A, the first photoresist layer 210 defines a circular layer (not labeled). It should be noted that the circular layer is only for demonstration, any closed-loop layer such as ellipse layer or rectangular layer can be used. As shown in FIG. 7A, the first photoresist layer 210 is used as a mask for etching the hard bottom mask layer LTO. Therefore, a bottom mask layer 220 is formed as shown in FIG. 7A. Afterward, the first photoresist layer 210 is used as mask for ion-implantation process and phosphor ion doses in the range of $10^{12}$-$10^{14}$ cm$^{-3}$ are doped in the lightly-doped P-type epitaxial layer 203 to form structure shown in FIG. 7A, where the structure includes heavily-doped N type area 40.

Figure 7B:
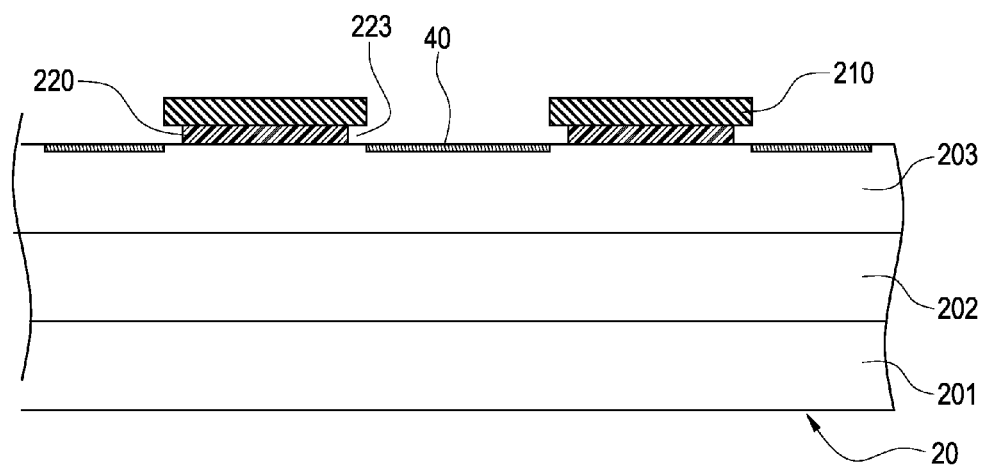
Figure 6C:
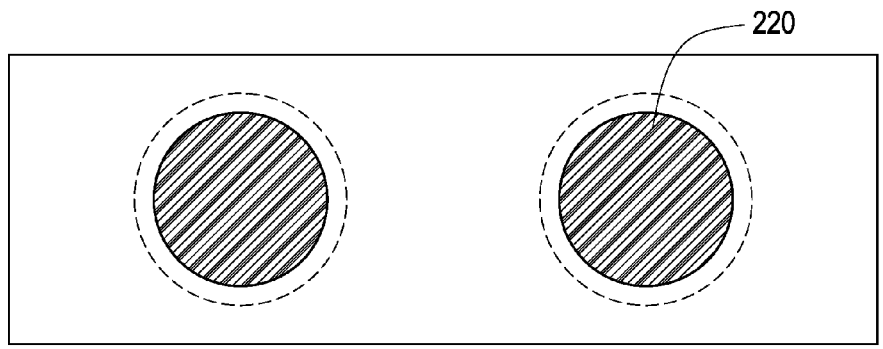

Afterward, as shown in FIGS. 7B, the first photoresist layer 210 is used as mask for isotropic etching the bottom mask layer 220 (for example, the etchant can be buffered oxide etchant, BOE). The bottom mask layer 220 below the first photoresist layer 210 is undercut inward to form recess 223. In other word, part of the first photoresist layer 210 hangs atop the bottom mask layer 220 by removing a portion of the bottom mask layer 220 below the first photoresist layer 210.

Figure 7C:
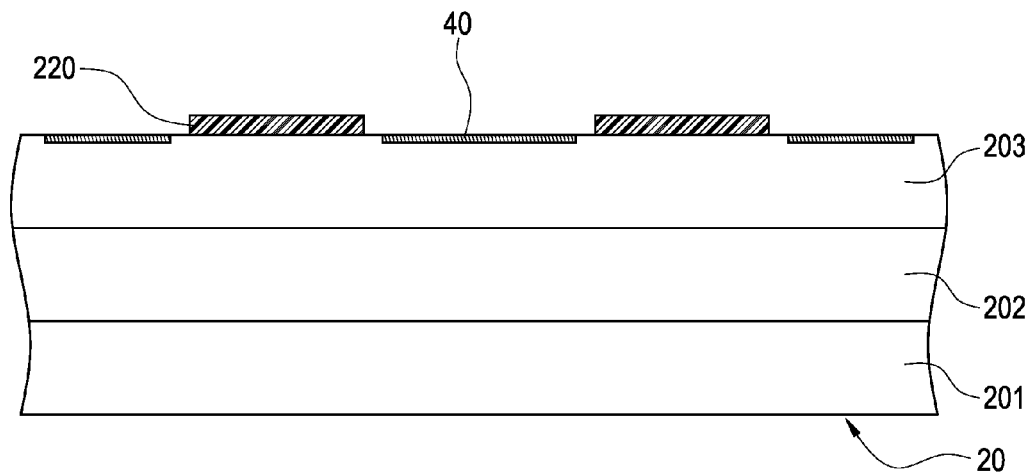
Figure 6D:
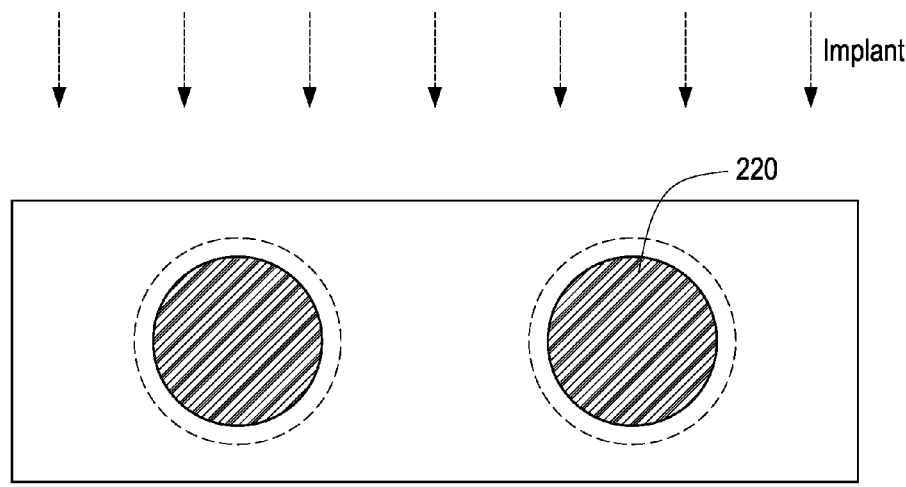

As shown in FIGS. 7C, after removing the first photoresist layer 210, a second BOE or DHF (distilled HF) process is conducted with controlled etching rate to remove the surface dirt on the bottom mask layer 220 such that the remaining mask layer 220 is clean as shown in FIG. 7C.

Figure 7D:
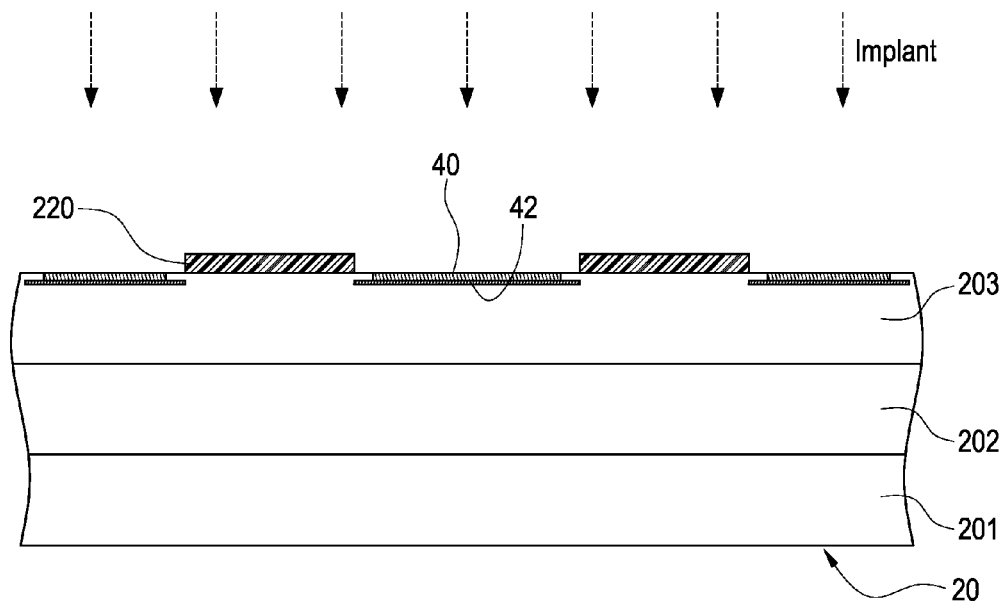

As shown in FIG. 7D, the remaining bottom mask layer 220 is used as mask for low-concentration N or P type doping on the resulting structure. The doping depth is such controlled that a lightly-doped N or P type area 42 is formed besides the heavily-doped N type area 40. Then the remaining bottom mask layer 220 is removed and a lightly-doped P-type epitaxial covering layer (not shown) is grown to cover the resulting structure.

Figure 7E:
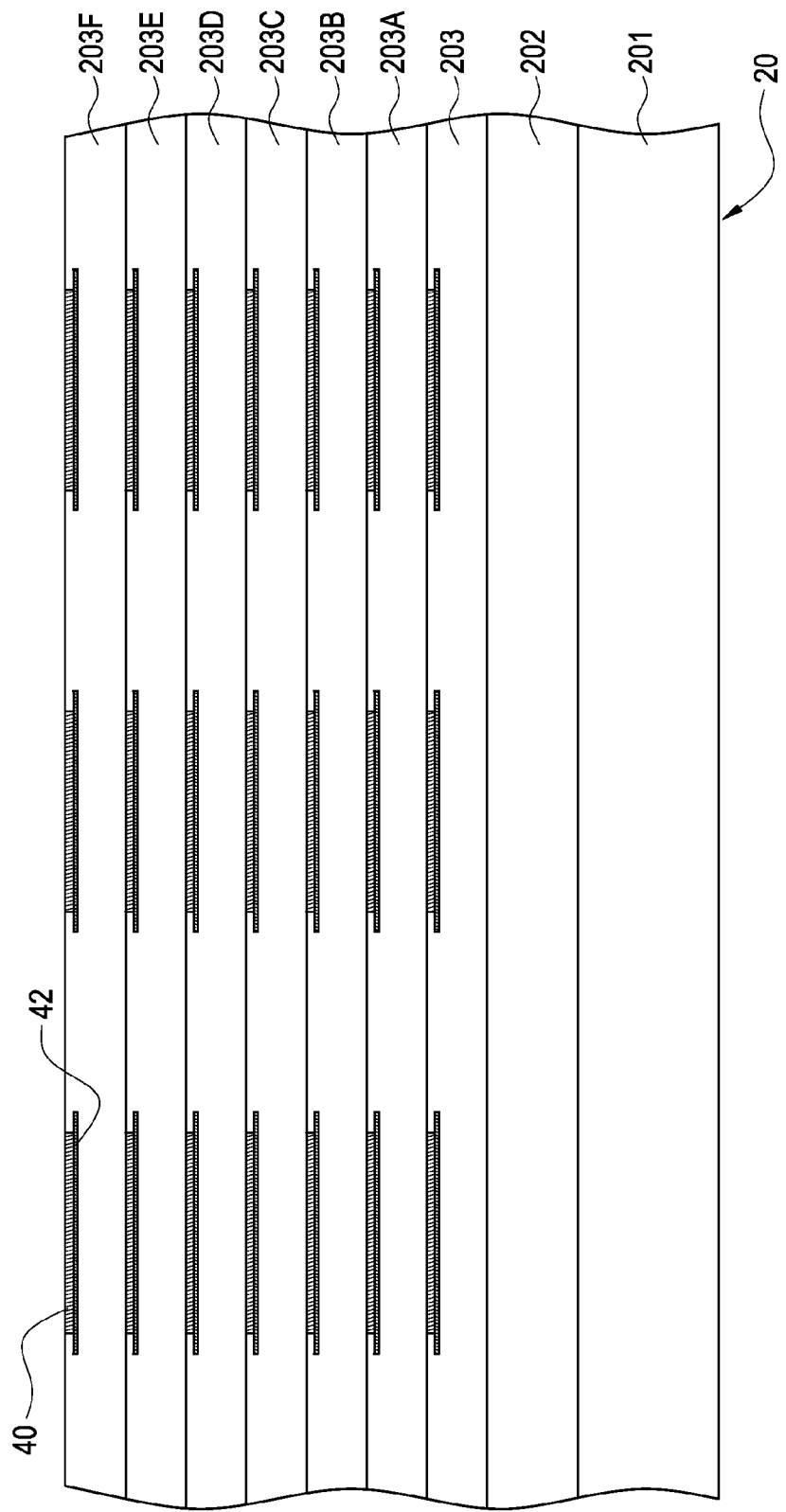

As shown in FIG. 7E, the above-mentioned steps are repeatedly performed (for example, the steps shown in FIGS. 7A to 7D are repeated six times) to form heavily-doped N type areas 40 and lightly-doped N type areas 42 on multiple layers, wherein numerals 203A~203F indicate the above-mentioned lightly-doped P-type epitaxial covering layers.

Figure 7F:
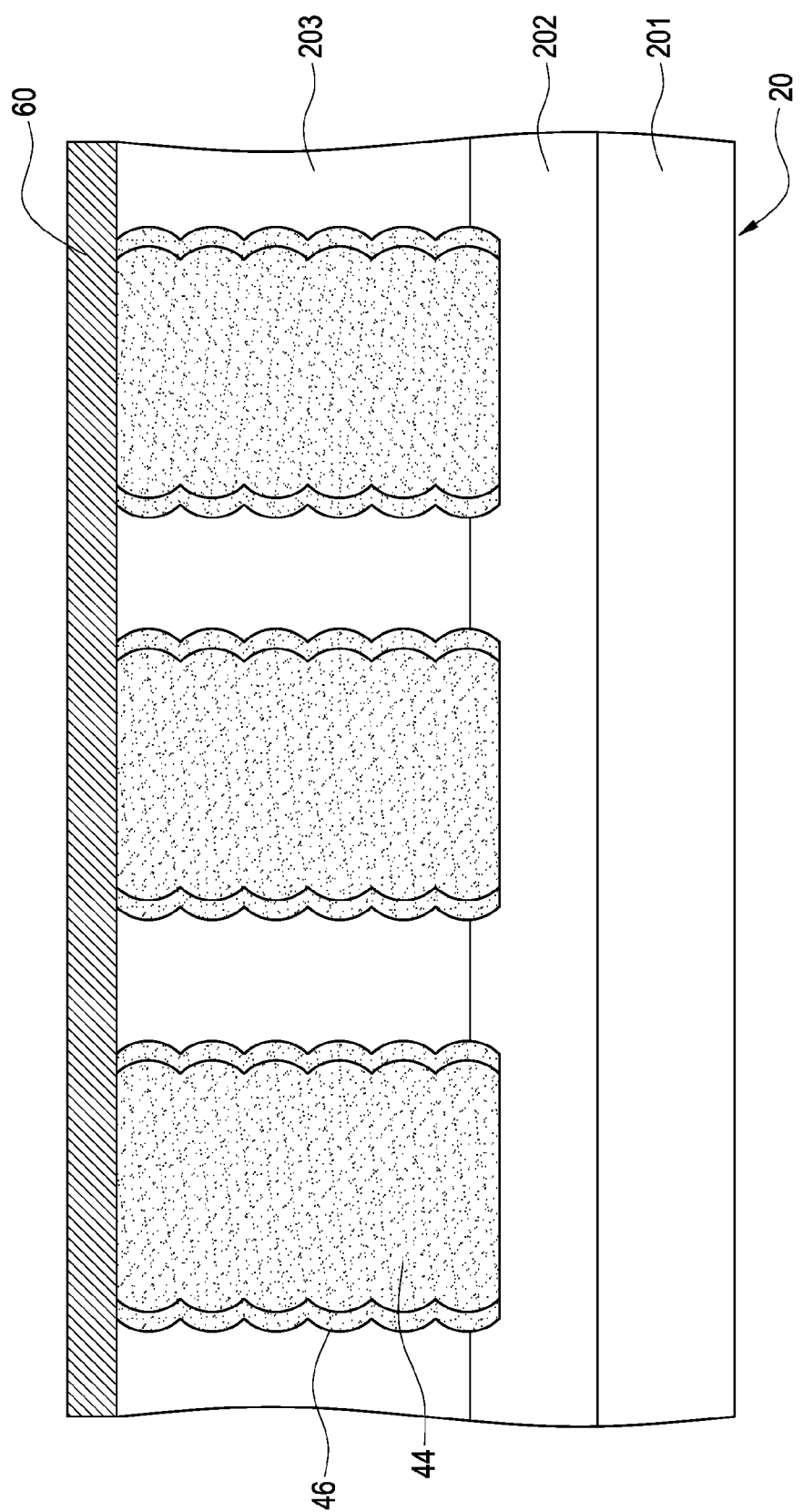

As shown in FIG. 7F, a field oxide layer 60 is formed on the resulting structure and dopant driving-in process are performed to connect the heavily-doped N type areas 40 and lightly-doped N or P type areas 42 on adjacent layers. Therefore, heavily-doped N type column 44 and lightly-doped N or P type side all 46 are formed. Moreover, even not clearly shown in FIG. 7F, the dopant concentration near the lateral surface of the super junction has nonlinear (such as graded) distribution along transversal direction in the drawing. For example, the dopant concentration monotonically increases from the lightly-doped N or P type sidewall 46 to the heavily-doped N type column 44. The resulting structure can be used as base to fabricate further semiconductor devices such as super junction MOSFET, super junction MESFET, super junction Schottky Rectifier, super junction IGBT, super junction thyristor and thyristor diode.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. A super junction for semiconductor device comprising:
a silicon substrate with a first conductive type epitaxial layer,
   a plurality of highly-doped second conductive type columns formed in the first conductive type epitaxial layer, the highly-doped second conductive type column extended from an upper face of the first conductive type epitaxial layer and substantially extended continuously along a depth direction of the first conductive type epitaxial layer, and
   a plurality of lightly-doped second conductive type side walls, each of the lightly-doped second conductive type side walls formed on an outer surface of one of the highly-doped second conductive type columns and extended from an upper face of the first conductive type epitaxial layer,
   wherein none of the highly-doped second conductive type columns and the lightly-doped second conductive type side walls extends all the way to the silicon substrate;
   wherein two adjacent highly-doped second conductive type columns have substantially the same structure, the two adjacent highly-doped second conductive type columns have substantially the same impurity concentration along the depth direction,
   wherein the highly-doped second conductive type columns and the lightly-doped second conductive type side walls are formed by growing a plurality of lightly-doped first conductive type epitaxial covering lagers on the first conductive type epitaxial layer, each of the lightly-doped first conductive type epitaxial covering layers having at least one highly-doped second conductive type area and at least one lightly-doped second conductive type area beside the highly-doped second conductive type area, and then by driving in the highly-doped second conductive type areas and the lightly-doped second conductive type areas.

2. The super junction for semiconductor device in claim 1, wherein the first conductive type is N type and the second conductive type is P type.

3. The super junction for semiconductor device in claim 1, wherein the first conductive type is P type and the second conductive type is N type.

4. The super junction for semiconductor device in claim 1, wherein the semiconductor device is one of super junction metal oxide semiconductor field effect transistor (MOSFET), super junction metal semiconductor field effect transistor (MESFET), super junction Schottky rectifier, super junction insulated gate bipolar transistor (IGBT), super junction thyristor and super junction diode.

* * * * *